US012743128B2

(12) United States Patent
Liao et al.

(10) Patent No.: US 12,743,128 B2
(45) Date of Patent: Sep. 22, 2026

(54) DISPLAY PANEL AND DISPLAY APPARATUS INCLUDING ELASTIC RECOVERY LAYER

(71) Applicant: Huawei Technologies Co., Ltd., Shenzhen (CN)

(72) Inventors: Feng Liao, Dongguan (CN); Yunsong Hu, Dongguan (CN); Lisheng Li, Shenzhen (CN); Ming Zhu, Dongguan (CN); Linchuan Zhang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 755 days.

(21) Appl. No.: 18/056,466

(22) Filed: Nov. 17, 2022

(65) Prior Publication Data

US 2023/0080831 A1 Mar. 16, 2023

Related U.S. Application Data

(63) Continuation of application No. PCT/CN2021/094794, filed on May 20, 2021.

(30) Foreign Application Priority Data

May 21, 2020 (CN) ......................... 202010435518.3

(51) Int. Cl.
*H10K 59/40* (2023.01)
*G06F 1/16* (2006.01)
(Continued)

(52) U.S. Cl.
CPC .......... *G06F 1/1637* (2013.01); *G06F 3/0412* (2013.01); *H10K 59/40* (2023.02);
(Continued)

(58) Field of Classification Search
CPC ...... H10K 50/844; H10K 50/86; H10K 59/40; H10K 59/873; H10K 59/8791;
(Continued)

(56) References Cited

U.S. PATENT DOCUMENTS 10,347,700 B2 * 7/2019 Yang ..................... G06F 3/0412
10,847,586 B2 * 11/2020 Lee ...................... H10K 50/844
(Continued)

FOREIGN PATENT DOCUMENTS

CN 106328003 A 1/2017
CN 106373983 A 2/2017
(Continued)

*Primary Examiner* — Ida M Soward
(74) *Attorney, Agent, or Firm* — WOMBLE BOND DICKINSON (US) LLP

(57) ABSTRACT

A display panel and a display apparatus are provided. The display panel includes a display layer, a package layer, and a functional film layer that are stacked in sequence, where the display layer includes a plurality of light emitting devices. The functional film layer is located on a side of the package layer that is far away from the display layer, the functional film layer includes at least one elastic recovery layer, and the display panel includes a bendable area. The elastic recovery layer is at least located in the bendable area. The elastic recovery layer can assist another film layer in performing arching recovery after bending, thereby reducing a risk that repeated bending causes film layer stripping or rupture and the arching of the bending part cannot be recovered in the flattened state.

20 Claims, 7 Drawing Sheets

(51) Int. Cl.
*G06F 3/041* (2006.01)
*H10K 59/80* (2023.01)
*H10K 59/35* (2023.01)

(52) U.S. Cl.
CPC ....... *H10K 59/873* (2023.02); *H10K 59/8791* (2023.02); *G06F 2203/04102* (2013.01); *H10K 59/35* (2023.02)

(58) Field of Classification Search
CPC ........ H10K 59/12; H10K 59/35; H10K 59/38; H10K 77/111; G06F 1/1637; G06F 1/1641; G06F 1/1643; G06F 1/1652; G06F 3/0412; G09F 9/301
See application file for complete search history.

(56) References Cited

U.S. PATENT DOCUMENTS

| | | | | |
|---|---|---|---|---|
| 10,860,123 | B2* | 12/2020 | Won | H10K 59/8731 |
| 11,075,251 | B2* | 7/2021 | Yang | G06F 3/0412 |
| 11,237,592 | B2* | 2/2022 | Rhe | G06F 3/0446 |
| 11,494,020 | B2* | 11/2022 | Mizuhashi | G06F 3/04184 |
| 2014/0367644 | A1 | 12/2014 | Song et al. | |
| 2016/0064685 | A1* | 3/2016 | Kim | B32B 37/003 428/137 |
| 2016/0098120 | A1* | 4/2016 | Miyake | G06F 1/1652 345/174 |
| 2016/0179259 | A1* | 6/2016 | Watanabe | G06F 3/0412 345/174 |
| 2016/0195983 | A1* | 7/2016 | Miyake | G06F 3/0448 345/174 |
| 2017/0064845 | A1 | 3/2017 | Jung et al. | |
| 2017/0278900 | A1* | 9/2017 | Yang | H10K 50/86 |
| 2017/0309867 | A1 | 10/2017 | Mun et al. | |
| 2017/0321087 | A1 | 11/2017 | Moon et al. | |
| 2018/0074553 | A1* | 3/2018 | Yamazaki | G06F 1/1616 |
| 2018/0181165 | A1* | 6/2018 | Park | H10K 59/126 |
| 2019/0131364 | A1* | 5/2019 | Hayk | G06F 3/0412 |
| 2019/0392737 | A1 | 12/2019 | Du et al. | |
| 2020/0127217 | A1 | 4/2020 | Bae et al. | |
| 2020/0183457 | A1 | 6/2020 | Youn et al. | |
| 2020/0386917 | A1 | 12/2020 | Hashimoto et al. | |
| 2021/0313122 | A1* | 10/2021 | Kawata | H01M 50/105 |

FOREIGN PATENT DOCUMENTS

| | | | | |
|---|---|---|---|---|
| CN | 206301307 | U | 7/2017 | |
| CN | 108615821 | A | 10/2018 | |
| CN | 109377889 | A | 2/2019 | |
| CN | 109411520 | A | 3/2019 | |
| CN | 109425922 | A | 3/2019 | |
| CN | 109461831 | A | 3/2019 | |
| CN | 109545087 | A | 3/2019 | |
| CN | 109785763 | A | 5/2019 | |
| CN | 110927834 | A | 3/2020 | |
| CN | 111047992 | A | 4/2020 | |
| CN | 111048549 | A * | 4/2020 | H10K 59/8791 |
| CN | 111653607 | A | 9/2020 | |
| EP | 3477442 | A2 * | 5/2019 | G06F 1/1637 |
| JP | 2010243930 | A | 10/2010 | |
| JP | 2017173492 | A | 9/2017 | |
| KR | 20180033390 | A | 4/2018 | |
| WO | 2018128171 | A1 | 7/2018 | |
| WO | 2019183985 | A1 | 10/2019 | |

* cited by examiner

DISPLAY PANEL AND DISPLAY APPARATUS INCLUDING ELASTIC RECOVERY LAYER

CROSS-REFERENCE TO RELATED APPLICATIONS

This application is a continuation of International Application No. PCT/CN2021/094794, filed on May 20, 2021, which claims priority to Chinese Patent Application No. 202010435518.3, filed on May 21, 2020. The disclosures of the aforementioned applications are hereby incorporated by reference in their entireties.

TECHNICAL FIELD

This application pertains to the field of display technologies, and more particularly, relates to a display panel and a display apparatus.

BACKGROUND

With development of display technologies, portable display apparatuses such as a mobile phone and a tablet computer become indispensable products in people's lives. A large-sized display screen can improve visual experience of a user, and is deeply liked by the user. However, the large-sized display screen also makes a display apparatus less portable, and therefore, a foldable display apparatus appears. The foldable display apparatus has a large-sized display screen in an unfolded state, and has a relatively small display screen in a folded state; and is applicable to different application scenarios, so that the foldable display apparatus can obtain a relatively small volume and is easy to carry. The foldable display apparatus brings multifunctional application scenarios and visual impact to the user. In an actual application, the display screen is in folded and flattened states for many times. A bending part of the display screen is at a risk of film layer stripping or rupture due to repeated bending. In the flattened state, a film layer of the bending part also has a problem that arching cannot be fully flattened. In addition, currently, there is also a problem of abnormal display caused by a package failure due to an impact on the display screen.

SUMMARY

In view of this, this application provides a display panel and a display apparatus, to resolve problems that repeated bending of the display panel causes film layer stripping or rupture, and arching of a bending part cannot be recovered in a flattened state, and to improve an impact resistance capability of the display panel.

An embodiment of this application provides a display panel, where the display panel includes: a display layer, a package layer, and a functional film layer that are stacked in sequence, where the display layer includes a plurality of light emitting devices; the functional film layer is located on a side of the package layer that is away from the display layer, and the functional film layer includes at least one elastic recovery layer; and the display panel includes a bendable area, and the elastic recovery layer is at least located in the bendable area.

In this embodiment of this application, the elastic recovery layer is disposed on the package layer, and the elastic recovery layer has a relatively good capability of recovering to an initial state after deformation. When the display panel changes from a bent state to a flattened state, the elastic recovery layer can assist another film layer in the panel in performing arching recovery after bending, thereby reducing a risk that repeated bending causes film layer stripping or rupture, and the arching of the bending part cannot be recovered in the flattened state. In addition, the elastic recovery layer has a good damping property. When the display panel is subjected to impact, the elastic recovery layer can absorb impact energy, so as to protect the package layer on a light emitting device, and avoid abnormal display due to a package failure, thereby improving an impact resistance capability of the display panel.

In some embodiments, the functional film layer further includes a first protective layer, and the first protective layer is located on a side of the elastic recovery layer that is away from the package layer. The first protective layer is configured to protect the display panel on a side of a display surface of the display panel.

In some embodiments, the functional film layer further includes a polarizer, and the polarizer is located on a side of the elastic recovery layer that is away from the first protective layer. Alternatively, the polarizer is located between the elastic recovery layer and the first protective layer. The polarizer can reduce reflection of ambient light by the display panel, so as to improve a display effect.

In some embodiments, the functional film layer further includes an adhesive layer, and two adjacent film layers in the functional film layer are bonded by using the adhesive layer. In some embodiments, the elastic recovery layer in the functional film layer and at least one film layer adjacent to the elastic recovery layer are in direct contact with each other and are integrated.

In one embodiment, the elastic recovery layer and the polarizer that are in the functional film layer are integrated.

In another embodiment, the elastic recovery layer and the first protective layer that are in the functional film layer are integrated.

In another embodiment, the first protective layer, the elastic recovery layer, and the polarizer that are stacked in sequence in the functional film layer are all integrated.

In some embodiments, the display panel further includes a touch structure layer, and the touch structure layer is located on a side of the package layer that is away from the display layer.

In some embodiments, the touch structure layer and the package layer are integrated. Disposing of the adhesive layer between the touch structure layer and the package layer is reduced, which helps to reduce a thickness of the display panel.

In some embodiments, the display panel further includes a touch structure layer and a color filter layer. The touch structure layer is in direct contact with the package layer, and the color filter layer is in direct contact with the touch structure layer. The package layer, the touch structure layer, and the color filter layer that are stacked in sequence are all integrated. The color filter layer includes a color filter unit and a light shielding part. In a direction perpendicular to the display panel, the color filter unit overlaps the light emitting device, and the light shielding part is located between two adjacent color filter units. The adhesive layer used in a bonding process of the touch structure layer and the package layer, and the adhesive layer used in a bonding process of the color filter layer and the touch structure layer are reduced. Therefore, use of the adhesive layer in a display panel structure is reduced, which helps to reduce the thickness of the display panel. In addition, the color filter layer is disposed on the touch structure layer. The color filter layer can reduce reflection of ambient light by the light emitting device and metal wiring, and can also reduce reflection of ambient light by the touch structure layer, thereby improving a display effect of the display panel.

In some embodiments, a thickness of the elastic recovery layer is d, and 20 μm≤d≤200 μm, where μm is micrometers.

In some embodiments, light transmittance of the elastic recovery layer for visible light is greater than 90%.

In some embodiments, an elastic recovery ratio of the elastic recovery layer is greater than 95%.

An embodiment of this application further provides a display apparatus, including a display panel provided in any embodiment of this application.

The display panel and the display apparatus provided in this application have the following beneficial effects: An elastic recovery layer is disposed on a package layer, and the elastic recovery layer has a relatively good capability of recovering to an initial state after deformation. When the display panel changes from a bent state to a flattened state, the elastic recovery layer can assist another film layer in the panel in performing arching recovery after bending, thereby reducing a risk that repeated bending causes film layer stripping or rupture, and the arching of the bending part cannot be recovered in the flattened state. In addition, the elastic recovery layer has a good damping property. When the display panel is subjected to impact, the elastic recovery layer can absorb impact energy, so as to protect the package layer on a light emitting device, and avoid abnormal display due to a package failure, thereby improving an impact resistance capability of the display panel.

DESCRIPTION OF EMBODIMENTS

Based on problems in the conventional technology, embodiments of this application provide a display panel and a display apparatus. An elastic recovery layer is disposed on a package layer in the display panel. The elastic recovery layer bends with a module structure during bending, and when the display panel is flattened, the elastic recovery layer can assist another film layer of a bending part in performing arching recovery after bending, thereby reducing a risk that repeated bending causes film layer stripping or rupture, and the arching of the bending part cannot be recovered in a flattened state. In addition, the elastic recovery layer has a good damping property. When the display panel is subjected to impact, the elastic recovery layer can absorb impact energy, so as to protect the package layer on a light emitting device, and avoid abnormal display due to a package failure, thereby improving an impact resistance capability of the display panel. In a film layer structure of the display panel, the elastic recovery layer and a film layer adjacent to the elastic recovery layer may be bonded by using an adhesive layer. Alternatively, during production, the elastic recovery layer is in direct contact with another film layer to form an integrated complex film, which is then bonded to another film layer structure of the display panel, so as to reduce use of the adhesive layer in the display panel. The following describes various embodiments of the present disclosure.

Figure 1:
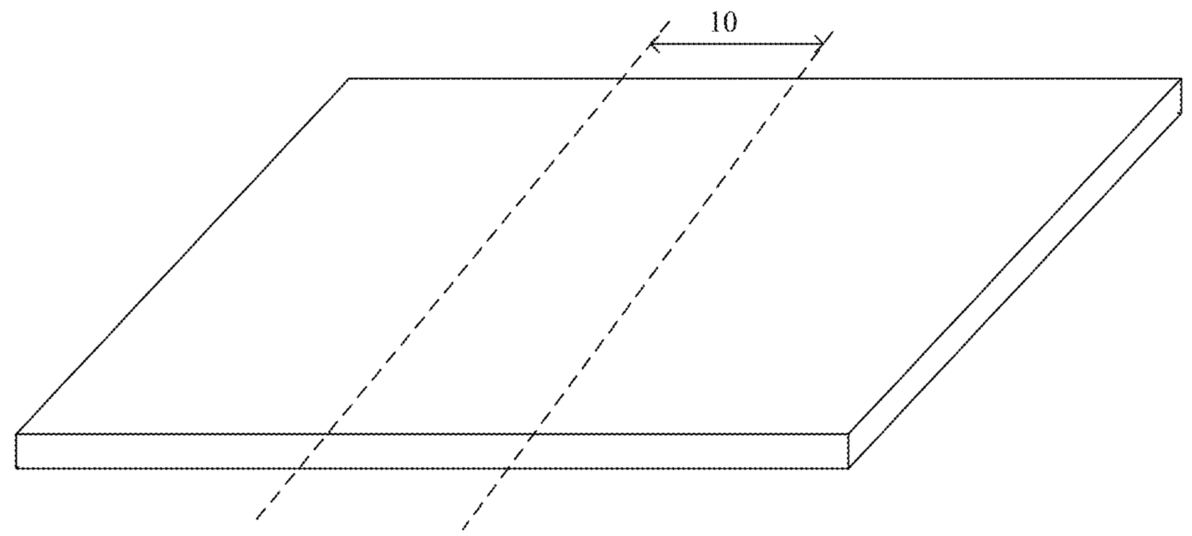
FIG. 1 is a schematic diagram of a flattened state of a display panel according to an embodiment of this application.
Figure 2:
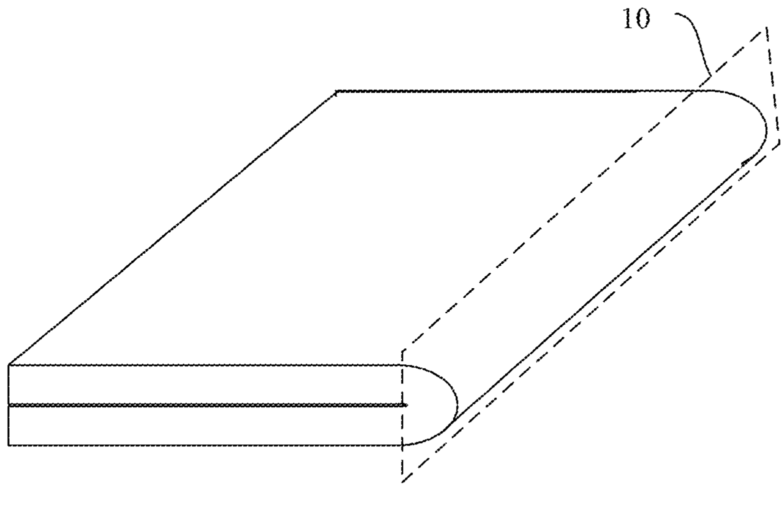
FIG. 2 is a schematic diagram of a bent state of a display panel according to an embodiment of this application.
Figure 3:
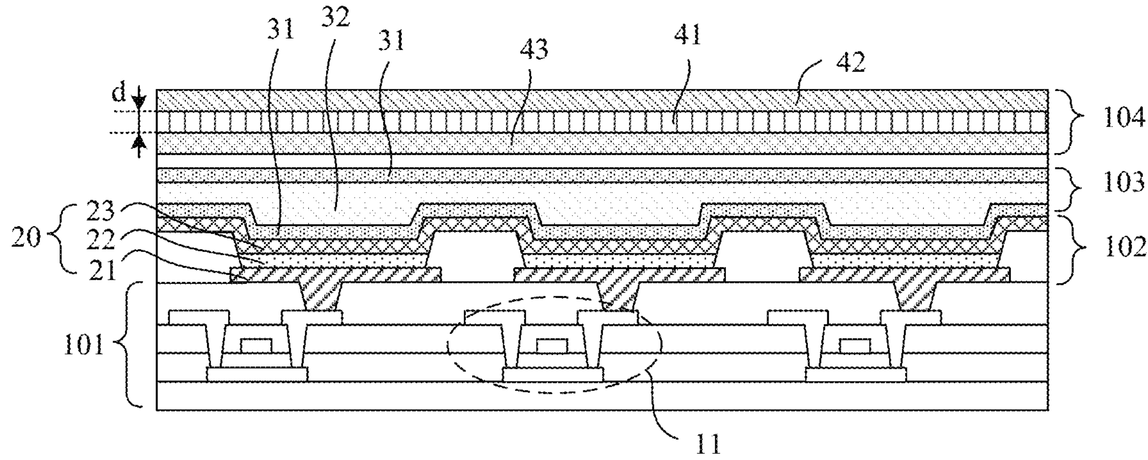
FIG. 3 is a schematic diagram of a film layer structure in a bent area of a display panel according to an embodiment of this application.
Figure 4:
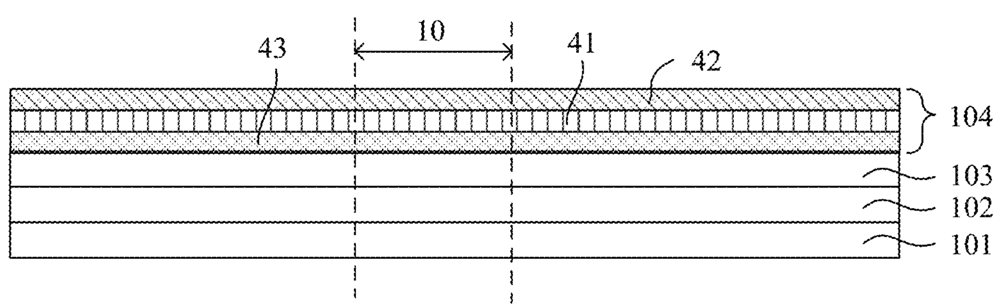
FIG. 4 is a schematic diagram of another film layer structure of a display panel according to an embodiment of this application.

The display panel provided in the embodiment of this application includes a bendable area, and the bendable area can be bent and deformed. The display panel includes a folded state and a flattened state. In the folded state, bending deformation occurs in the bendable area; and in the flattened state, the bendable area is recovered from deformation, and the display panel is recovered to the flattened state. FIG. 1 is a schematic diagram of a flattened state of a display panel according to an embodiment of this application, and FIG. 2 is a schematic diagram of a bent state of a display panel according to an embodiment of this application. FIG. 3 is a schematic diagram of a film layer structure in a bent area of a display panel according to an embodiment of this application. FIG. 4 is a schematic diagram of another film layer structure of a display panel according to an embodiment of this application.

A bendable area 10 of the display panel is shown in FIG. 1, and a bent state is shown in FIG. 2. In a folded state, the bendable area 10 is deformed, which is equivalent to that the display panel is half-folded and bent to form upper and lower lamination structures. In an embodiment, the bendable area 10 is located in a central area of the display panel. When the display panel is half-folded and bent, the upper and lower lamination structures are parallel and flush with each other. In some embodiments, if the bendable area 10 deviates from the central area of the display panel, when the display panel is half-folded and bent, there is a dislocation in the upper and lower lamination structures. It should be noted that FIG. 1 merely shows that the display panel includes one bendable area 10. This application imposes no limitation on a quantity of bendable areas in the display panel. In some embodiments, the display panel may alternatively include two or more bendable areas. For example, the display panel includes two bendable areas. When bending deformation occurs in the two bendable areas in a folded state, the display panel may form a three-layer lamination structure.

As shown in FIG. 3, the display panel includes: an array substrate 101, a display layer 102, and a package layer 103 that are stacked in sequence. The display layer 102 includes a plurality of light emitting devices 20, and the figure further shows that the light emitting device 20 includes an anode 21, a light emitting layer 22, and a cathode 23. The anode 21 is a reflection anode, the cathode 23 is a transparent cathode, the light emitting layer 22 can emit light directly towards the cathode 23, and this part of light is directly emitted from the cathode 23. In addition, the light emitting layer 22 also emits light towards the anode 21, and this part of light is reflected by the anode 21 and then emitted from the cathode 23. Therefore, a light emitting surface of the display layer 102 is a surface on a side of the cathode 23; and light is emitted from the display layer 102 towards the package layer 103, and then penetrates another structure layer of the display panel to be emitted from the display panel. The array substrate 101 includes a plurality of thin film transistors 11 and a plurality of signal lines (not shown). A drain (not shown) of the thin film transistor 11 is electrically connected to the anode 21 of the light emitting device 20. In the figure, the thin film transistor 11 is merely shown as a top gate structure. The package layer 103 is configured to perform package protection on the light emitting device 20, so as to isolate water and oxygen, and ensure a service life of the light emitting device 20. In some embodiments, the package layer 103 includes an organic package layer and an inorganic package layer that are alternately stacked. The figure merely shows that the package layer 103 includes two inorganic package layers 31 and one organic package layer 32.

The display panel further includes a functional film layer 104, where the functional film layer 104 is located on a side of the package layer 103 that is away from the display layer 102. The functional film layer 104 includes at least one elastic recovery layer 41; and the elastic recovery layer 41 has a relatively good capability of recovering to an initial state after bending, and can be used to assist another film layer in performing arching recovery after bending. In this embodiment of the present disclosure, the elastic recovery layer 41 is at least located in the bendable area 10, that is, the elastic recovery layer 41 may be disposed only in the bendable area 10, or an entire-layer elastic recovery layer 41 may be disposed. As shown in FIG. 4, a bendable area 10 and an elastic recovery layer 41 disposed on a whole surface are shown, and the elastic recovery layer 104 disposed on a whole surface can facilitate structure flatness of display panel.

During production of the display panel, a substrate is first provided, and an array substrate, a display layer, a package layer, and the like are successively produced on the substrate to form a display module. In this application, structure layers directly formed on the substrate may be collectively referred to as a display module. The functional film layer is located on the display module, and the functional film layer includes structure layers such as a polarizer, a protective layer, and an adhesive layer. The functional film layer is bonded to the display module by using the adhesive layer.

Still referring to FIG. 3, FIG. 3 shows that the functional film layer further includes a first protective layer 42 and a polarizer 43. The first protective layer 42 is located on a side of the elastic recovery layer 41 that is away from the package layer 103, and the polarizer 43 is located on a side of the elastic recovery layer 41 that is away from the first protective layer 42. The first protective layer 42 may be an ultra-thin glass layer or a polyimide film, and the first protective layer 42 is configured to protect another film layer in the display panel. The polarizer 43 can reduce reflection of ambient light by the display panel, so as to improve a display effect. In some embodiments, a hard cover layer is further disposed on the first protective layer 42, and a hardness of the hard cover layer is greater than a hardness of the first protective layer. The hard cover layer can further protect another film layer in the display panel.

In the display panel structure, film layers such as a polarizer, a protective layer, and an adhesive layer further need to be disposed on the package layer. In a process in which the display panel changes from being bent to being flattened, elastic recovery capabilities of different film layers are different, as a result, some film layers cannot be recovered to an initial flattened state, and a phenomenon of arching of the bending part and film layer stripping or even rupture occurs. In this embodiment of this application, the elastic recovery layer is disposed on the package layer, and the elastic recovery layer has a relatively good capability of recovering to an initial state after deformation. When the display panel changes from a bent state to a flattened state, the elastic recovery layer can assist another film layer in the panel in performing arching recovery after bending, thereby reducing a risk that repeated bending causes film layer stripping or rupture, and the arching of the bending part cannot be recovered in the flattened state. In addition, the elastic recovery layer has a good damping property. When the display panel is subjected to impact, the elastic recovery layer can absorb impact energy, so as to protect the package layer on a light emitting device, and avoid abnormal display due to a package failure, thereby improving an impact resistance capability of the display panel.

In some embodiments, light transmittance of the elastic recovery layer for visible light is greater than 90%, and a haze of the elastic recovery layer is less than 1.2%, so that it is ensured that the elastic recovery layer has high transparency. The elastic recovery layer is disposed on a side of a light emitting surface of the display layer, and high transparency of the elastic recovery layer can avoid affecting the display effect.

In some embodiments, an elastic recovery ratio of the elastic recovery layer is greater than 95%, and the elastic recovery ratio is a proportion of a recoverable part in tensile deformation. For example, when the elastic recovery layer is pre-stretched by 20%, the elastic recovery ratio of the elastic recovery layer is greater than 95%. The elastic recovery ratio of the elastic recovery layer is relatively high, which can ensure that the elastic recovery layer still has a very good recovery capability after bending after the display panel is repeatedly bent for use.

An elastic restoring force of the elastic recovery layer is F, and $10\ MJ\cdot m^{-3} \leq F \leq 50\ MJ\cdot m^{-3}$. The elastic restoring force is a restoring force after deformation due to an external force. In this application, the elastic restoring force of the elastic recovery layer meets a value range, so as to ensure that when the display panel transitions from a bent state to a flattened state, the elastic recovery layer can generate a strong enough restoring force, to ensure that the elastic recovery layer can assist another film layer in performing arching recovery after bending.

An elastic modulus of the elastic recovery layer is 50-800 MPa. The elastic modulus is used to measure a degree of difficulty in generating elastic deformation of a material. In this application, the elastic modulus of the elastic recovery layer meets a range, so that it is ensured that the elastic recovery layer has flexibility and can be bent with the display panel; and has rigidity and can assist another film layer in performing arching recovery after bending in a flattened state.

In this embodiment of this application, a material for producing the elastic recovery layer includes a high molecular polymer material, which may be a thermoplastic elastic material or a thermosetting elastic material. The thermoplastic elastic material includes, for example, thermoplastic polyurethane, a polyene elastomer, and a polyether elastomer; and the thermosetting elastic material includes, for example, ethylene-vinyl acetate copolymer, an organosilicon elastomer, sulfonated polyether sulfone, and polyamide (nylon).

In an embodiment, the material for producing the elastic recovery layer includes thermoplastic polyurethane. A thermoplastic polyurethane material has a wide hardness range, has a high elasticity in a range of Shore A 60-Shore D 80, and has flexibility in a wide temperature range from −40° C. to 120° C. In addition, the thermoplastic polyurethane material also has good performance such as weather resistance and high energy ray resistance, and advantages such as high tensile strength, high elongation, and a low permanent deformation rate of long-term compression. The elastic recovery layer made of the thermoplastic polyurethane material can effectively assist another film layer in the panel in performing arching recovery after bending, and improve an impact resistance capability of the display panel.

In some embodiments, a hardness is adjusted by controlling a ratio of a hard segment to a soft segment when the high molecular polymer material is produced. The hard segment is a relatively rigid molecular chain segment, such as aromatic hydrocarbon, in the high molecular polymer material; and the soft segment is a relatively flexible molecular chain segment, such as aliphatic hydrocarbon. For example, the material for producing the elastic recovery layer includes thermoplastic polyurethane. To further have features of high light transmittance, non-yellowing due to ultraviolet, high toughness, and a high elastic recovery ratio in a high hardness state, aliphatic series (such as macromolecule glycol, polyisocyanate, and a chain extender) may be used to increase a proportion of the soft segment during production.

In some embodiments, as shown in FIG. 3, a thickness of the elastic recovery layer 41 is d, and 20 μm≤d≤200 μm. The thickness of the elastic recovery layer meets a range, to ensure that the elastic recovery layer has a relatively good elastic recovery capability, so as to assist another film layer in performing arching recovery after bending. In addition, a damping property of the elastic recovery layer can protect the package layer from an impact of an external force, so as to avoid abnormal display due to a package failure. This application further provides a method for producing an elastic recovery layer. In some embodiments, the process includes:

Operation S101: Feed a predetermined quantity of elastomer granular materials into a rolling machine based on a sample preparation requirement. A key physical property table of a material needs to be determined before feeding, including a hot-melting temperature, a film-forming temperature, a preprocessing condition, and the like.

Operation S102: Perform drying processing on the elastomer granular material to remove water, so as to ensure later film-forming quality. A drying temperature and time may be set in drying processing once more based on a material composition of the elastomer granular material.

Operation S103: Obtain slurry by heating and melting elastomer granules by stages. Because an elastomer material is a high molecular polymer material, to still have high light transmittance and a high elastic recovery ratio in a relatively high hardness state, a molecular structure of the elastomer material needs to be specially designed, and a melting process temperature range is relatively large, so that slurry in a uniform melting state can be obtained by heating by regions and stages.

Operation S104: Spray slurry in a hot-melting state by using a die head with a specified slit width. An extrusion temperature, an extrusion rate, and an extrusion pressure need to be set based on an elastomer material characteristic.

Operation S105: The slurry in the hot-melting state is sprayed out from the die head, and then flows onto a setting roller, where the setting roller ensures a setting temperature by water cooling. A film-forming setting temperature range is generally 20° C.-40° C.

The foregoing operation S101 to operation S105 provide the method for producing an elastic recovery layer. When a film layer of the elastic recovery layer is produced alone, a release film may be first laid on a carrier substrate, then the elastic recovery layer is produced on the release film by using the foregoing method, and then a release film is produced on the elastic recovery layer. During production of the panel, the release films on both sides of the elastic recovery layer are removed, and the elastic recovery layer and a structure layer of the display panel are bonded by using an adhesive layer.

In an embodiment, the elastic recovery layer is made of one material; and in another embodiment, the elastic recovery layer is made of two or more materials.

In an embodiment, the elastic recovery layer is a one-layer structure made of one material. In another embodiment, the elastic recovery layer is a two-layer structure or a multi-layer structure, and the two-layer structure or the multi-layer structure may also be made of a same material. Alternatively, different structure layers in the elastic recovery layer are made of different materials. For example, the elastic recovery layer includes a first structure layer, a second structure layer, and a third structure layer that are stacked in sequence. Bond performance of both the first structure layer and the third structure layer is greater than bond performance of the second structure layer, and an elastic recovery capability of the second structure layer in the structure layers is the strongest. That is, two or more structure layers with different physical properties are coordinated to form an elastic recovery layer, so as to ensure that the elastic recovery layer has a relatively strong elastic recovery capability and relatively high visible light transmittance, which can ensure that the elastic recovery layer has good bonding reliability with another film layer in the display panel.

When the elastic recovery layer includes a two-layer structure or a multi-layer structure, each structure layer may be produced with reference to the foregoing process of operation S101 to operation S105. For example, the elastic recovery layer includes two structure layers. After the first structure layer is produced, the second structure layer is directly produced on the first structure layer, and finally an integrated elastic recovery layer is formed. That is, this is a structure that is formed depending on a production process and in which adjacent structure layers are in close contact with each other and bonded, and adjacent structure layers in the integrated elastic recovery layer are in contact with each other and tightly bonded.

The elastic recovery layer may also be produced together with another film layer to form an integrated complex film. For example, the elastic recovery layer and the first protective layer can form an integrated first complex film. During production, the first protective layer is used as a carrier substrate, and the elastic recovery layer is produced on the first protective layer by using the process in the foregoing operation S101 to operation S105 on the first protective layer. The elastic recovery layer and the first protective layer are subjected to thermal bonding to obtain the integrated first complex film. Then, a release film is laid on the first complex film. During production of the display panel, after the release film is removed, the first complex film and the structure layer of the display panel are bonded by using the adhesive layer.

In this application, the foregoing involves "the integrated elastic recovery layer" and "the integrated first complex film", and the following further involves "adjacent layers (or structures) are integrated, for example, the elastic recovery layer and the polarizer are integrated". "Integrated" is understood as a structure in which two or three film layers are successively produced and formed depending on a production process, and the layers can be in close contact with each other and bonded without using an adhesive layer. For example, the integrated first complex film means that the elastic recovery layer and the first protective layer are integrated, and the elastic recovery layer and the first protective layer have no adhesive layer. In the following embodiments, references may be made to this description for understanding when an "integrated" structure is involved.

In another embodiment, after the integrated first complex film is obtained, the polarizer is produced on the elastic recovery layer of the first complex film by continuously using a rolling process, and bonding between the polarizer and the elastic recovery layer is implemented based on a property that the elastic recovery layer has bond performance at a temperature, so as to form an integrated second complex film including the first protective layer, the elastic recovery layer, and the polarizer. Then, a release film is laid on the second complex film. During production of the display panel, after the release film is removed, the second complex film and the structure layer of the display panel are bonded by using the adhesive layer.

FIG. 3 shows that a functional film layer includes a first protective layer, an elastic recovery layer, and a polarizer, and shows a case in which the elastic recovery layer may be located between the first protective layer and the polarizer. In another embodiment, the polarizer is located between the first protective layer and the elastic recovery layer, that is, positions of the elastic recovery layer and the polarizer may be interchanged. In another embodiment, the functional film layer includes a first protective layer and an elastic recovery layer, that is, the functional film layer does not include a polarizer. In addition, two adjacent film layers in the functional film layer may be bonded by using the adhesive layer. Alternatively, the elastic recovery layer is in direct contact with a film layer adjacent to the elastic recovery layer to form an integrated structure. For example, the elastic recovery layer and the first protective layer are integrated. No adhesive layer needs to be disposed between the elastic recovery layer and the first protective layer for bonding. During production, the first protective layer may be used as a carrier substrate, the elastic recovery layer is directly produced on the first protective layer to form an integrated complex film, and then the complex film and another structure of the display panel are bonded by using the adhesive layer. A structure of the functional film layer is described in detail by using an example in the following embodiment.

Figure 5:
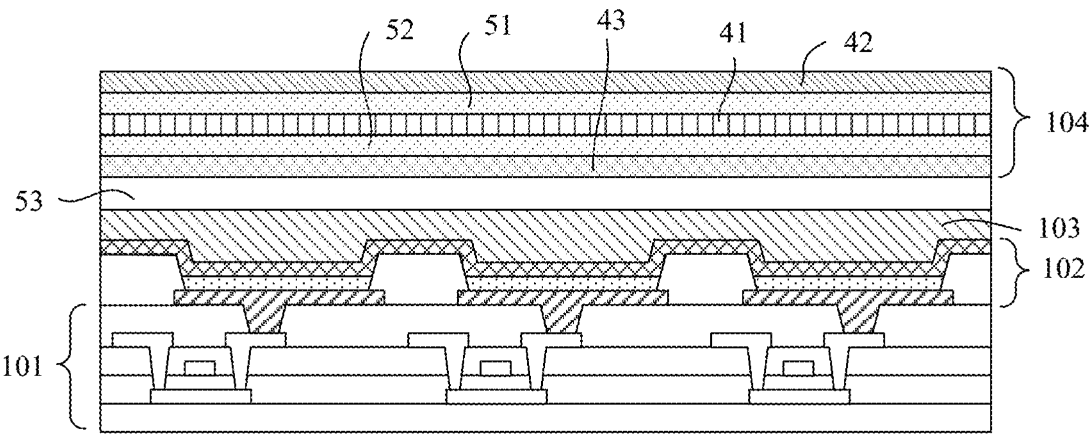
FIG. 5 is a schematic diagram of another film layer structure of a display panel according to an embodiment of this application.

In an embodiment, two adjacent film layers in the functional film layer are bonded by using the adhesive layer. FIG. 5 is a schematic diagram of another film layer structure of a display panel according to an embodiment of this application. A functional film layer 104 includes an elastic recovery layer 41, a first protective layer 42, and a polarizer 43, where the elastic recovery layer 41 is located between the first protective layer 42 and the polarizer 43. The functional film layer 104 further includes at least a first adhesive layer 51 and a second adhesive layer 52. The first protective layer 42 and the elastic recovery layer 41 are bonded by using the first adhesive layer 51, and the elastic recovery layer 41 and the polarizer 43 are bonded by using the second adhesive layer 52. A third adhesive layer 53 is further disposed in the display panel, and the polarizer 43 and a module structure below are bonded by using the third adhesive layer 53. In FIG. 5, only one example that a module structure below the polarizer 43 is a package layer 103 is used. During production of the display panel, after a process of the package layer 103 is completed, the third adhesive layer 53 is produced, and then the polarizer 43 is bonded on the third adhesive layer 53. Then, the second adhesive layer 52 is produced on the polarizer 43, and then the elastic recovery layer 41 is bonded on the second adhesive layer 52. Then, the first adhesive layer 51 is produced on the elastic recovery layer 41, and the first protective layer 42 is bonded on the first adhesive layer 51. In some embodiments, the elastic recovery layer can assist the first protective layer, the polarizer, and the adhesive layer that are in the functional film layer in performing arching recovery after bending, so as to prevent film layer stripping between film layers after repeated bending. In addition, the elastic recovery layer can protect the package layer from an impact of an external force, so as to avoid abnormal display due to a package failure.

FIG. 5 merely shows that the elastic recovery layer is located between the first protective layer and the polarizer. In another embodiment, the polarizer is located between the first protective layer and the elastic recovery layer in the functional film layer, and two adjacent film layers in the functional film layer are bonded by using the adhesive layer. No further schematic diagram is shown herein.

Figure 6:
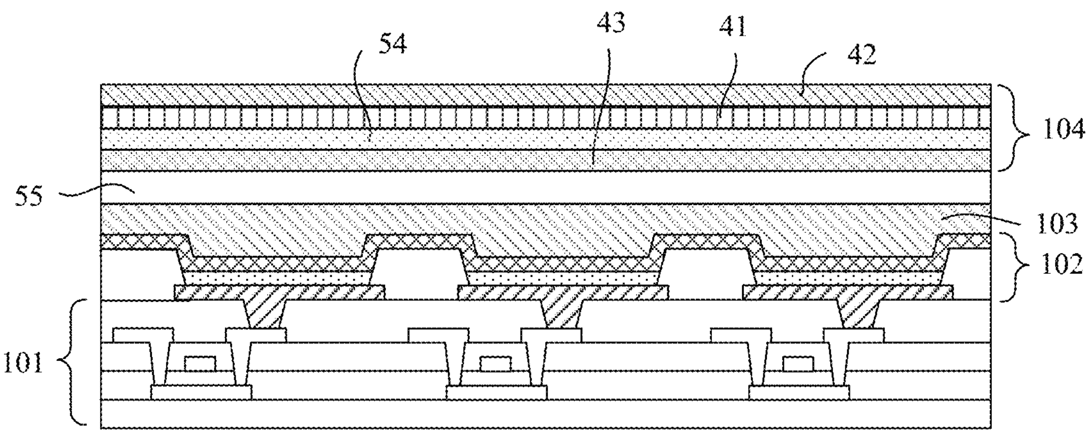
FIG. 6 is a schematic diagram of another film layer structure of a display panel according to an embodiment of this application.

In another embodiment, the elastic recovery layer in the functional film layer and at least one film layer adjacent to the elastic recovery layer are integrated. FIG. 6 is a schematic diagram of another film layer structure of a display panel according to an embodiment of this application. A functional film layer includes an elastic recovery layer 41, a first protective layer 42, and a polarizer 43. The first protective layer 42 is in direct contact with the elastic recovery layer 41, and the first protective layer 42 and the elastic recovery layer 41 are integrated. The polarizer 43 is located on a side of the elastic recovery layer 41 that is away from the first protective layer 42. The functional film layer further includes a fourth adhesive layer 54. The elastic recovery layer 41 and the polarizer 43 are bonded by using the fourth adhesive layer 54, and the polarizer 43 and a module structure below are bonded by using a fifth adhesive layer 55. The first protective layer and the elastic recovery layer are integrated, that is, no adhesive layer is disposed between the first protective layer and the elastic recovery layer, but an integrated structure in which the first protective layer and the elastic recovery layer are in direct contact with each other and tightly bonded is formed depending on a production process. The first protective layer and the elastic recovery layer are an integrated first complex film. For a production method for the integrated first complex film, references may be made to the foregoing description about the production process of the elastic recovery layer. The first protective layer is used as a carrier substrate, and a material for producing the elastic recovery layer may be directly produced on the first protective layer by using a heat flow casting process to form the integrated first complex film. In some embodiments, the first protective layer is in direct contact with the elastic recovery layer, so that use of the adhesive layer in the display panel structure is reduced, and a thickness of the display panel is reduced. In FIG. 6, only one example that a module structure below the polarizer 43 is a package layer 103 is used for description. During production of the display panel, after a process of the package layer 103 is completed, the fifth adhesive layer 55 is produced, and the polarizer 43 is bonded on the fifth adhesive layer 55. Then the fourth adhesive layer 54 is produced on the polarizer 43, and the first complex film is bonded on the fourth adhesive layer.

Figure 7:
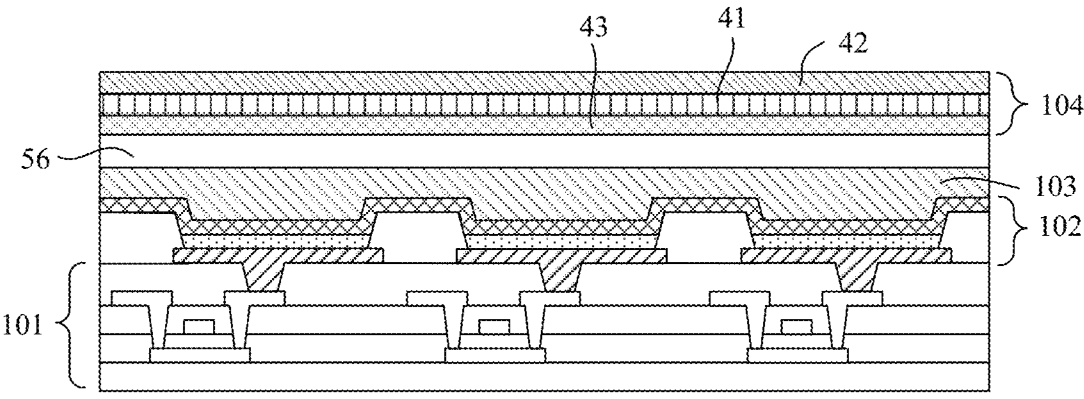
FIG. 7 is a schematic diagram of another film layer structure of a display panel according to an embodiment of this application.

In another embodiment, the elastic recovery layer in the functional film layer and two film layers adjacent to the elastic recovery layer are in direct contact. FIG. 7 is a schematic diagram of another film layer structure of a display panel according to an embodiment of this application. A functional film layer includes a first protective layer 42, an elastic recovery layer 41, and a polarizer 43 that are stacked in sequence. The first protective layer 42 is in direct contact with the elastic recovery layer 41, the elastic recovery layer 41 is in direct contact with the polarizer 43, and the first protective layer 42, the elastic recovery layer 41, and the polarizer 43 are all integrated. The polarizer 43 and a module structure below are bonded by using a sixth adhesive layer 56. In some embodiments, the first protective layer, the elastic recovery layer, and the polarizer are an integrated second complex film, that is, two adjacent film layers in the first protective layer, the elastic recovery layer, and the polarizer that are stacked in sequence do not need to be disposed with an adhesive layer therebetween. For a production method for the integrated second complex film, references may be made to the foregoing description about the production process of the elastic recovery layer. The first protective layer is used as a carrier substrate, a material for producing the elastic recovery layer may be directly produced on the first protective layer by using a heat flow casting process, and then the polarizer is produced on the elastic recovery layer by using a rolling process. Bonding between the polarizer and the elastic recovery layer is implemented based on a property that the elastic recovery layer has bond performance at a temperature, so as to obtain the integrated second complex film, which can further reduce disposing of the adhesive layer in the display panel structure, and further facilitate reducing the thickness of the display panel. In FIG. 7, only one example that a module structure below the polarizer 43 is a package layer 103 is used for description. During production of the display panel, after a process of the package layer 103 is completed, the sixth adhesive layer 56 is produced, and then the integrated second complex film is bonded on the sixth adhesive layer 56.

Figure 8:
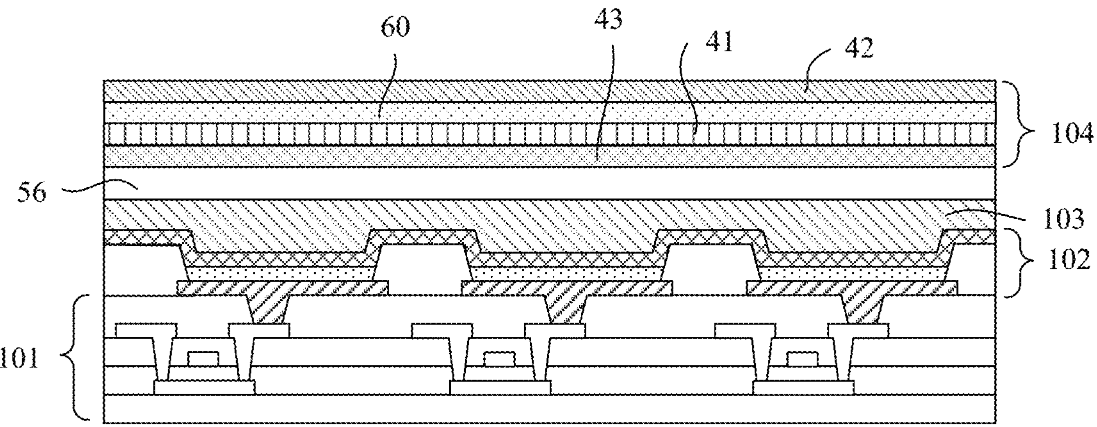
FIG. 8 is a schematic diagram of another film layer structure of a display panel according to an embodiment of this application.

In another embodiment, FIG. 8 is a schematic diagram of another film layer structure of a display panel according to an embodiment of this application. A functional film layer includes a first protective layer 42, an elastic recovery layer 41, and a polarizer 43 that are stacked in sequence. The elastic recovery layer 41 and the polarizer 43 are integrated, the elastic recovery layer 41 is in direct contact with the polarizer 43, and the elastic recovery layer 41 and the first protective layer 42 are bonded by using an adhesive layer 60. In some embodiments, the elastic recovery layer and the polarizer are integrated, and the elastic recovery layer and the polarizer form an integrated third complex film. During production, the polarizer is used as a carrier substrate, and the elastic recovery layer is directly produced on the polarizer to form the third complex film. The elastic recovery layer and the polarizer do not need an adhesive layer therebetween, but are in direct contact with each other and tightly bonded to form an integrated structure. In FIG. 8, only one example that a module structure below the polarizer 43 is a package layer 103 is used for description. During production of the display panel, after a process of the package layer 103 is completed, the sixth adhesive layer 56 is produced, then the integrated third complex film is bonded on the sixth adhesive layer 56, then the adhesive layer 60 is produced on the integrated third complex film, and the first protective layer 42 is bonded on the adhesive layer 60.

In another embodiment, the elastic recovery layer and the polarizer are integrated, the polarizer is located between the elastic recovery layer and the first protective layer, and the first protective layer and the polarizer are bonded by using the adhesive layer. No further schematic diagram is shown herein. For a production process, references may also be made to the embodiment in FIG. 8 for understanding. Details are not described herein again.

Figure 9:
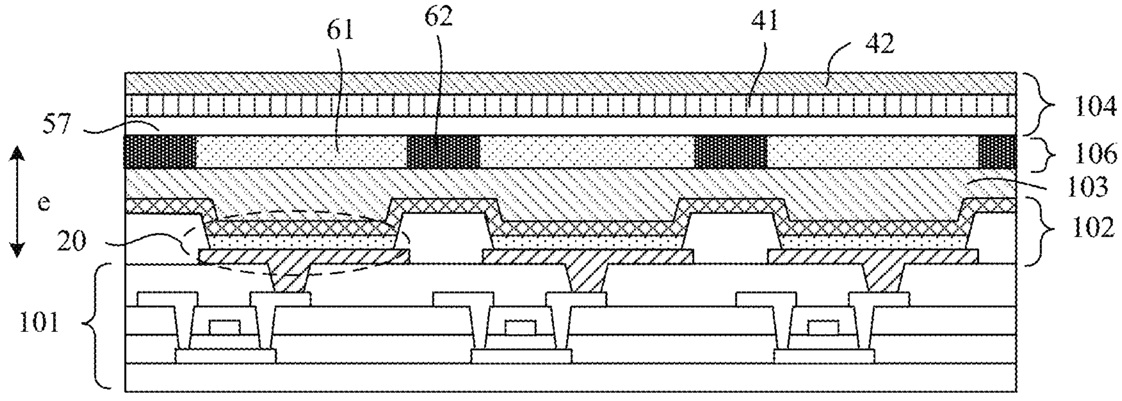
FIG. 9 is a schematic diagram of another film layer structure of a display panel according to an embodiment of this application.

In another embodiment, FIG. 9 is a schematic diagram of another film layer structure of a display panel according to an embodiment of this application. As shown in FIG. 9, a functional film layer 104 includes a first protective layer 42 and an elastic recovery layer 41, and the first protective layer 42 is in direct contact with the elastic recovery layer 41. The first protective layer and the elastic recovery layer are integrated, that is, the first protective layer and the elastic recovery layer are in direct contact to form an integrated first complex film. For a production method for the integrated first complex film, refer to the description in the foregoing embodiment. Details are not described herein again. In some embodiments, the first protective layer and the elastic recovery layer are integrated, so that use of the adhesive layer in the display panel structure is reduced, and the thickness of the display panel is reduced. The display panel further includes a color filter layer 106. The color filter layer 106 includes a color filter unit 61 and a light shielding part 62. In a direction e perpendicular to the display panel, the color filter unit 61 overlaps a light emitting device 20, and the light shielding part 62 is located between two adjacent color filter units 61. The color filter layer 106 and the elastic recovery layer 41 are bonded by using a seventh adhesive layer 57. The color filter unit includes a red filter unit, a blue filter unit, and a green filter unit. The light emitting device includes a red light emitting device that can emit red light, a green light emitting device that can emit green light, and a blue light emitting device that can emit blue light. The red filter unit overlaps the red light emitting device, the green filter unit overlaps the green light emitting device, and the blue filter unit overlaps the blue light emitting device. The color filter unit may transmit visible light in a predetermined wavelength range. For example, the red filter unit may transmit red light, that is, the color filter unit can prevent transmission of light in a wavelength range other than the predetermined wavelength range, which can reduce light which is incident in the display panel from ambient light, so as to reduce reflection of the ambient light by the display panel. In addition, when light that penetrates a color filter unit of a color is reflected by a light emitting device that overlaps the color filter unit, and is incident towards a color filter unit of another color, the light cannot penetrate the color filter unit of the other color and be emitted from the display panel, so that reflection of the ambient light by the display panel can be reduced, and a display effect of the display panel can be improved. In some embodiments, a color filter layer is produced in the display panel, so as to reduce the reflection of the ambient light by the display panel, thereby reducing a bonding process of the polarizer.

In another embodiment, the functional film layer includes a first protective layer and an elastic recovery layer, and the display panel includes a color filter layer. Different from the embodiment corresponding to FIG. 9, the first protective layer and the elastic recovery layer are bonded by using an adhesive layer. No further schematic diagram is shown herein.

Figure 10:
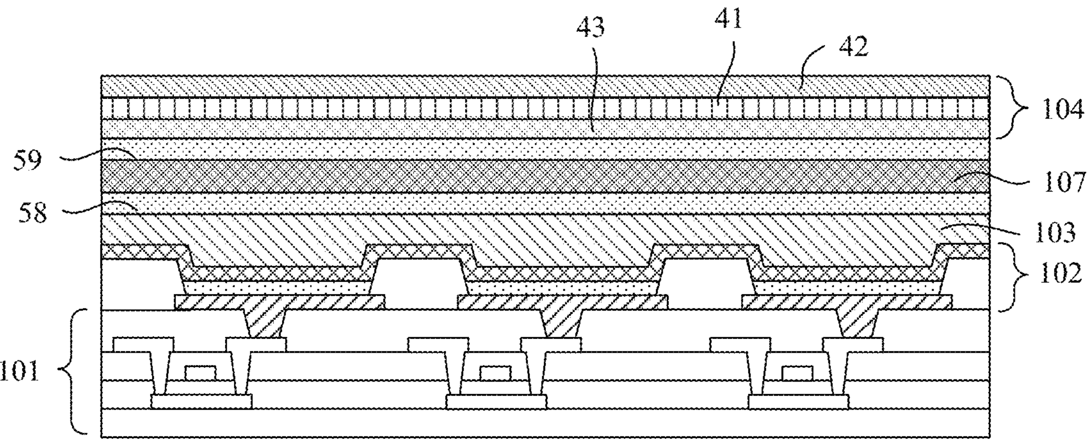
FIG. 10 is a schematic diagram of another film layer structure of a display panel according to an embodiment of this application.
Figure 11:
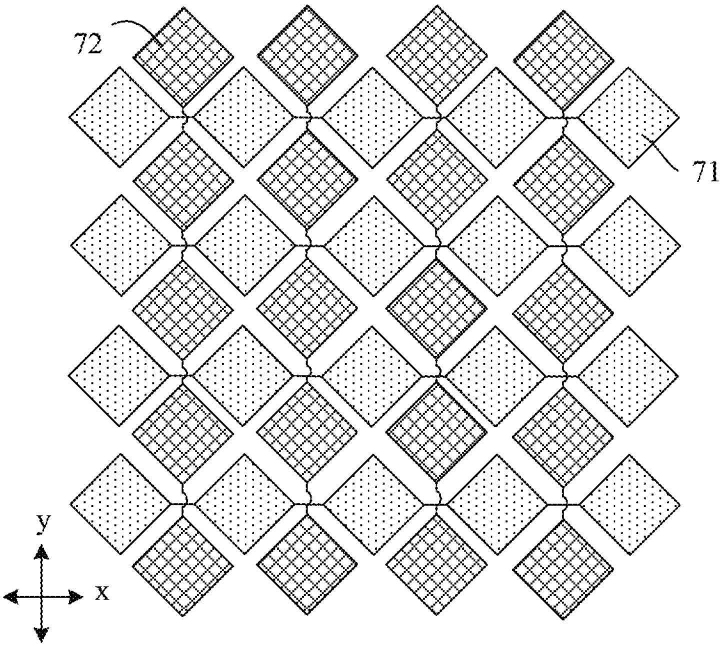
FIG. 11 is a schematic diagram of a local top view of a touch structure layer according to an embodiment of this application.

The display panel provided in this embodiment of this application further includes a touch structure layer. FIG. 10 is a schematic diagram of another film layer structure of a display panel according to an embodiment of this application. FIG. 11 is a schematic diagram of a local top view of a touch structure layer according to an embodiment of this application. As shown in FIG. 10, a touch structure layer 107 is located on a side of a package layer 103 that is away from a display layer 102. The figure shows that the touch structure layer 107 and the package layer 103 are bonded by using an eighth adhesive layer 58. The touch structure layer 107 and a functional film layer 104 are bonded by using a ninth adhesive layer 59. FIG. 11 shows a structure of the touch structure layer. The touch structure layer includes a plurality of first touch electrodes 71 and a plurality of second touch electrodes 72, and the touch structure layer includes a plurality of electrode rows and a plurality of electrode columns. The plurality of first touch electrodes 71 are arranged into electrode rows along a first direction x, and two adjacent first touch electrodes 71 in one electrode row are electrically connected. The plurality of second touch electrodes 72 are arranged into electrode columns along a second direction y, and two adjacent second touch electrodes 72 in one electrode column are electrically connected. In some embodiments, the touch structure layer and a film layer adjacent to the touch structure layer are bonded and fastened by using the adhesive layer. In FIG. 10, for example, the functional film layer includes a first protective layer, an elastic recovery layer, and a polarizer that are stacked in sequence. The elastic recovery layer can assist the first protective layer and the polarizer that are in the functional film layer in performing arching recovery after bending, so as to prevent film layer stripping between film layers after repeated bending. In addition, the elastic recovery layer can protect the package layer from an impact of an external force, so as to avoid abnormal display due to a package failure. In some embodiments, a touch electrode in the touch structure layer, and a connecting wire for connecting the touch electrode are made of a metal material. The touch structure layer is disposed below the polarizer. The polarizer can reduce reflection of ambient light by a light emitting device and metal wiring, and can reduce reflection of ambient light by the touch structure layer, so as to improve a display effect of the display panel.

Figure 12:
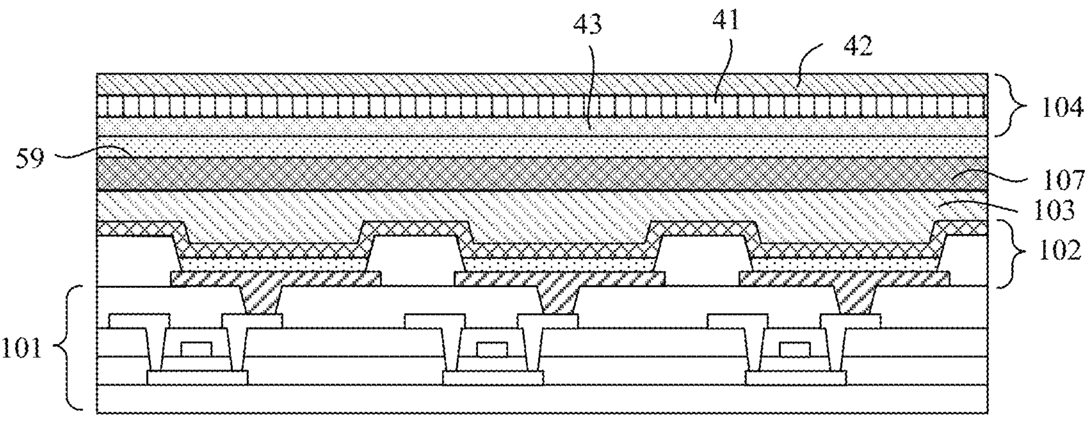
FIG. 12 is a schematic diagram of another film layer structure of a display panel according to an embodiment of this application.

In another embodiment, FIG. 12 is a schematic diagram of another film layer structure of a display panel according to an embodiment of this application. A touch structure layer 107 is in direct contact with a package layer 103, and the touch structure layer 107 and the package layer 103 are integrated. During production, after a process of the package layer 103, the touch structure layer 107 is directly produced on the package layer 103 without needing an adhesive layer, to form an integrated structure, so that disposing of the adhesive layer between the touch structure layer 107 and the package layer 103 is reduced, which facilitates reducing a thickness of the display panel.

As shown in the foregoing embodiments of FIG. 10 and FIG. 12, the functional film layer includes a first protective layer, an elastic recovery layer, and a polarizer that are stacked in sequence. Actually, the functional film layers in the foregoing embodiments of FIG. 5 to FIG. 8 may be applied to the foregoing embodiments of FIG. 10 and FIG. 12, and no further schematic diagram is shown herein.

Figure 13:
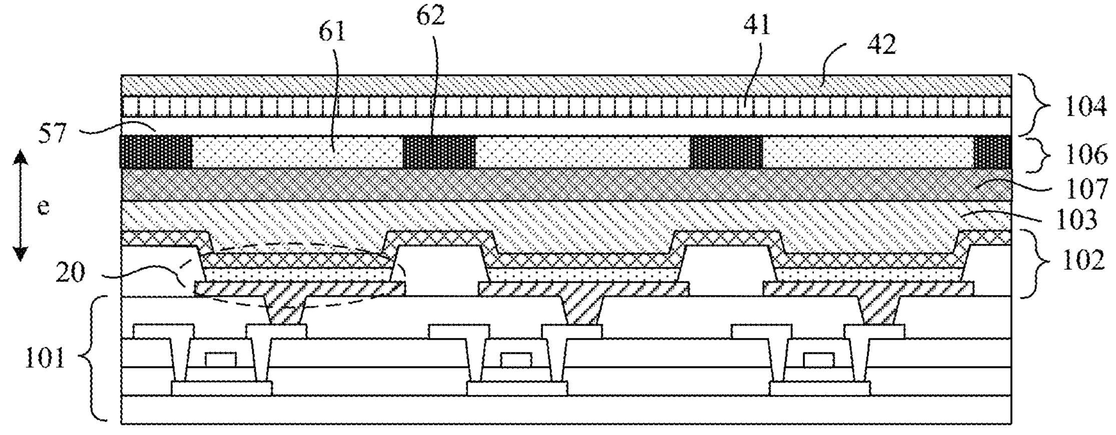
FIG. 13 is a schematic diagram of another film layer structure of a display panel according to an embodiment of this application.

In another embodiment, FIG. 13 is a schematic diagram of another film layer structure of a display panel according to an embodiment of this application. The display panel further includes a touch structure layer 107 and a color filter layer 106, and the color filter layer is located on a side of the touch structure layer 107 that is away from a package layer 103. The touch structure layer 107 is in direct contact with the package layer 103, and the color filter layer 106 is in direct contact with the touch structure layer 107, that is, the package layer 103, the touch structure layer 107, and the color filter layer 106 are all integrated. The color filter layer 106 includes a color filter unit 61 and a light shielding part 62. In a direction e perpendicular to the display panel, the color filter unit 61 overlaps a light emitting device 20, and the light shielding part 62 is located between two adjacent color filter units 61. A functional film layer 104 includes a first protective layer 42 and an elastic recovery layer 41, and the elastic recovery layer 41 and the color filter layer 106 are bonded by using a seventh adhesive layer 57. During production of the display panel, after a process of the package layer, the touch structure layer 107 is directly produced on the package layer 103, and then the color filter layer 106 is produced on the touch structure layer 107. The package layer 103, the touch structure layer 107, and the color filter layer 106 form an integrated structure. No adhesive layer needs to be disposed between layers, so that an adhesive layer used in a bonding process of the touch structure layer and the package layer and an adhesive layer used in a bonding process of the color filter layer and the touch structure layer are reduced. Therefore, use of the adhesive layer in a display panel structure is reduced, which facilitates reducing a thickness of the display panel. In addition, the color filter layer is disposed on the touch structure layer. The color filter layer can reduce reflection of ambient light by the light emitting device and metal wiring, and can also reduce reflection of ambient light by the touch structure layer, thereby improving a display effect of the display panel.

Figure 14:
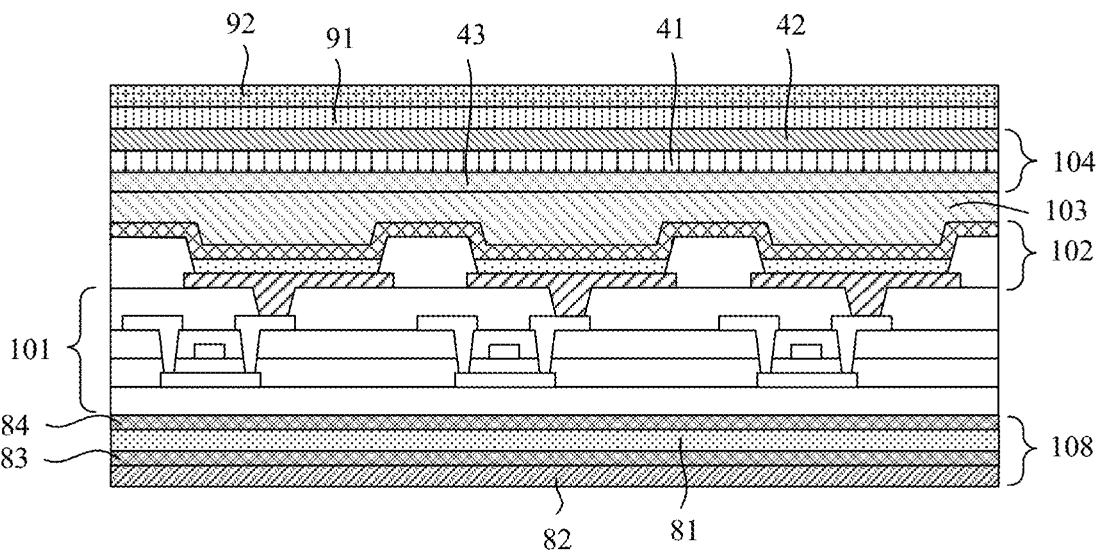
FIG. 14 is a schematic diagram of another film layer structure of a display panel according to an embodiment of this application.

In another embodiment, FIG. 14 is a schematic diagram of another film layer structure of a display panel according to an embodiment of this application. As shown in FIG. 14, the display panel further includes a second protective layer 91. The second protective layer 91 is located on a side of a first protective layer 42 that is away from an elastic recovery layer 41, and a hard cover layer 92 is further disposed on the second protective layer 91. A hardness of the hard cover layer 92 is greater than a hardness of the first protective layer 42, and the hardness of the hard cover layer 92 is greater than a hardness of the second protective layer 91. The hard cover layer 92 can further protect a film layer inside the display panel. A lower protective layer 108 is further disposed on a side of an array substrate 101 that is away from a display layer 102. In some embodiments, the lower protective layer 108 includes a basal layer 81 and a support layer 82, an adhesive layer 83 is disposed between the basal layer 81 and the support layer 82, and the lower protective layer 108 and the array substrate 101 are bonded by using an adhesive layer 84. The lower protective layer is configured to protect a module structure inside the display panel on a back side of the display panel.

Figure 15:
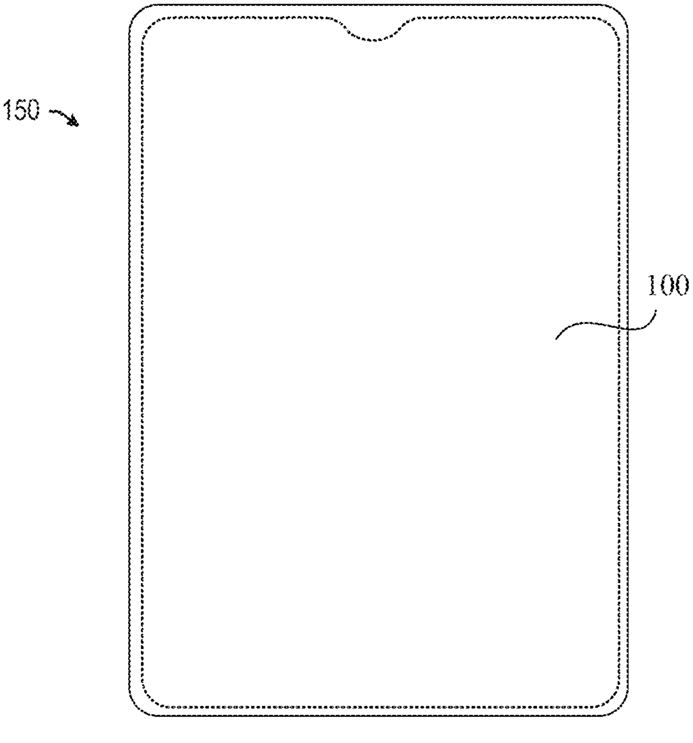
FIG. 15 is a schematic diagram of a display apparatus according to an embodiment of this application.

Based on a same inventive concept, an embodiment of this application further provides a display apparatus. FIG. 15 is a schematic diagram of a display apparatus 150 according to an embodiment of this application. As shown in FIG. 15, the display apparatus 150 includes a display panel 100 provided in any embodiment of this application. The display apparatus 150 shown in FIG. 15 is merely a schematic description. The display apparatus 150 may be, for example, a vehicle-mounted display apparatus, a mobile phone, a tablet computer, a notebook computer, an electronic book, a television, or a flexible wearable product.

The foregoing descriptions are merely embodiments of the present disclosure, but are not intended to limit the protection scope of the present disclosure. Any variation or replacement readily figured out by a person skilled in the art within the technical scope disclosed in the present disclosure shall fall within the protection scope of the present disclosure.

What is claimed is:

1. A display panel, comprising:

a display layer comprising a plurality of light emitting devices;

a package layer; and a functional film layer comprising at least one elastic recovery layer located in a bendable area of the display panel and assisting at least one adjacent film layer in the display panel in performing arching recovery, wherein the functional film layer is located on a side of the package layer that is away from the display layer; and the functional film layer further comprises a first protective layer that is located on a side of the elastic recovery layer that is away from the package layer.

2. The display panel according to claim 1, wherein the functional film layer further comprises a polarizer that is located on a side of the elastic recovery layer that is away from the first protective layer.

3. The display panel according to claim 2, wherein the first protective layer and the elastic recovery layer are integrated and bonded using an adhesive layer.

4. The display panel according to claim 2, wherein the first protective layer, the elastic recovery layer, and the polarizer are all integrated.

5. The display panel according to claim 2, wherein the elastic recovery layer and the polarizer are integrated, and the first protective layer and the elastic recovery layer are bonded using an adhesive layer.

6. The display panel according to claim 2, wherein the first protective layer and the elastic recovery layer are bonded using an adhesive layer, and the elastic recovery layer and the polarizer are bonded using an adhesive layer.

7. The display panel according to claim 1, wherein the functional film layer further comprises a polarizer that is located between the first protective layer and the elastic recovery layer.

8. The display panel according to claim 7, wherein the elastic recovery layer and the polarizer are integrated, and the first protective layer and the polarizer are bonded using an adhesive layer.

9. The display panel according to claim 7, wherein the first protective layer and the polarizer are bonded using an adhesive layer, and the polarizer and the elastic recovery layer are bonded using an adhesive layer.

10. The display panel according to claim 1, wherein the display panel further comprises a touch structure layer, and the touch structure layer is located on a side of the package layer that is away from the display layer.

11. The display panel according to claim 10, wherein the touch structure layer and the package layer are integrated.

12. The display panel according to claim 1, wherein the display panel further comprises:

a touch structure layer;

a color filter layer, wherein the color filter layer is located on a side of the touch structure layer that is away from the package layer, the color filter layer comprising:

one or more color filter units that overlap a light emitting device in a direction perpendicular to the display panel; and a light shielding part that is located between two adjacent color filter units; and wherein the package layer, the touch structure layer, and the color filter layer are all integrated.

13. The display panel according to claim 1, wherein a thickness of the elastic recovery layer is d, wherein 20 μm≤d≤200 μm.

14. The display panel according to claim 1, wherein light transmittance of the elastic recovery layer for visible light is greater than 90%.

15. The display panel according to claim 1, wherein an elastic recovery ratio of the elastic recovery layer is greater than 95%.

16. A display apparatus, comprising:

a display panel, the display panel comprising:

a display layer comprising a plurality of light emitting devices;

a package layer; and a functional film layer comprising at least one elastic recovery layer located in a bendable area of the display panel and assisting at least one adjacent film layer in the display panel in performing arching recovery, wherein the functional film layer is located on a side of the package layer that is away from the display layer; and the functional film layer further comprises a first protective layer that is located on a side of the elastic recovery layer that is away from the package layer.

17. The display apparatus according to claim 16, wherein the functional film layer further comprises a polarizer that is located on a side of the elastic recovery layer that is away from the first protective layer.

18. The display apparatus according to claim 17, wherein the first protective layer and the elastic recovery layer are integrated and bonded using an adhesive layer.

19. The display apparatus according to claim 17, wherein the first protective layer, the elastic recovery layer, and the polarizer are all integrated.

20. The display apparatus according to claim 17, wherein the elastic recovery layer and the polarizer are integrated, and the first protective layer and the elastic recovery layer are bonded using an adhesive layer.

* * * * *